United States Patent
Tojo

(10) Patent No.: US 6,980,570 B2
(45) Date of Patent: Dec. 27, 2005

(54) SOLID LASER APPARATUS

(75) Inventor: Koji Tojo, Sagamihara (JP)

(73) Assignee: Shimadzu Corporation, Kyoto (JP)

( * ) Notice: Subject to any disclaimer, the term of this patent is extended or adjusted under 35 U.S.C. 154(b) by 16 days.

(21) Appl. No.: 10/848,465

(22) Filed: May 17, 2004

(65) Prior Publication Data
US 2004/0247002 A1 Dec. 9, 2004

(30) Foreign Application Priority Data
Jun. 5, 2003 (JP) .............................. 2003-160164

(51) Int. Cl.$^7$ ............................................... H01S 3/30
(52) U.S. Cl. ........................................... 372/6; 372/92
(58) Field of Search ..................................... 372/6, 92

(56) References Cited

U.S. PATENT DOCUMENTS

| | | | |
|---|---|---|---|
| 5,099,308 A | 3/1992 | Murayama | ................... 357/71 |
| 5,867,305 A * | 2/1999 | Waarts et al. | .......... 359/337.12 |
| 6,301,271 B1 * | 10/2001 | Sanders et al. | ................. 372/3 |
| 6,331,991 B1 * | 12/2001 | Mahgerefteh | ................ 372/33 |
| 6,839,365 B1 * | 1/2005 | Sonoda et al. | ................ 372/22 |
| 6,882,665 B2 * | 4/2005 | Miura et al. | .................. 372/22 |
| 2004/0258360 A1 * | 12/2004 | Lim et al. | ..................... 385/43 |

FOREIGN PATENT DOCUMENTS

| | | |
|---|---|---|
| JP | 3120828 | 5/1991 |
| JP | 3223648 | 10/1991 |
| JP | 05-093931 | 4/1993 |

* cited by examiner

Primary Examiner—Wilson Lee
(74) Attorney, Agent, or Firm—Jordan and Hamburg LLP

(57) ABSTRACT

A solid laser apparatus is provided comprising a semiconductor light emitter 1, an optical fiber 3 having a grating part 6 provided therein, and a wavelength converter 5 for receiving an input of light from an optical resonator composed of the semiconductor light emitter 1 and the optical fiber 3 and releasing its harmonic light, wherein the distance D between the grating part 6 and the wavelength converter 5 is equal to or greater than ½ of the coherent length of the input light.

2 Claims, 1 Drawing Sheet

SOLID LASER APPARATUS

FIELD OF THE INVENTION

The present invention relates to a solid laser apparatus and more particularly to a solid laser apparatus which can produce an output of harmonic light at stable level.

BACKGROUND OF THE INVENTION

A semiconductor laser module is known which includes a combination of a laser diode and an optical fiber having a grating part provided therein for stabilizing the wavelength of a laser output (See document 1 as an example).

Also, a technique is known for using a wavelength converter to carry out an action of wavelength conversion from a laser beam of which the wavelength has been fixed by a grating part to harmonics (See document 2 as an example).

Moreover, a technique is known for having a wavelength converter beveled at the incident end for attenuating the return of light transmitted back from a wavelength converter towards a laser source (See document 3 as an example).

Document 1
    Japanese Patent No. 3120828

Document 2
    Japanese Patent No. 3223648

Document 3
    Japanese Patent Laid-open Publication (Heisei) 5-93931

(Problems that the Invention is to Solve)

It is probable that the return of light transmitted back from a wavelength converter towards a laser source may make the output of light unstable. One of the prior arts is designed for attenuating the return of light with the use of a wavelength converter beveled at the incident end.

However, when the wavelength converter is beveled at the incident end, its coupling efficiency with the laser source will be declined hence lowering the energy of light output. In addition, the beveling of the incident end of the wavelength converter may be a troublesome task.

It is hence an object of the present invention to provide a solid laser apparatus which is arranged simple in the construction for making the output of harmonic light stable.

SUMMARY OF THE INVENTION

As a first aspect of the present invention, a solid laser apparatus is provided comprising a semiconductor light emitter, an optical fiber having a grating part provided therein, and a wavelength converter for receiving an input of light from an optical resonator composed of the semiconductor light emitter and the optical fiber and releasing its harmonic light, wherein the distance between the grating part and the wavelength converter is equal to or greater than ½ of the coherent length of the input light.

The coherent length is a maximum of difference in the length of the light path which can generate a pattern of interference between two components of light divided by a beam splitter, passed through different paths, and combined together. More particularly, as the difference in the length of the light path is increased from zero, it creates a pattern of interference. The pattern of interference will then be faded. The coherent length is thus equal to a maximum of difference in the length of the light path when the pattern of interference appears.

The solid laser apparatus of the first aspect has the distance between the grating part and the wavelength converter set to not smaller than ½ of the coherent length. This allows a difference in the length of the light path between the light reflected by the grating part and returned to the source of laser light and the light reflected by the wavelength converter, passed through the grating part, and returned back to the source of laser light to be greater than the coherent length. As a result, the return of light transmitted from the grating part to the source of laser light remains not interfered by the light reflected from the wavelength converter. Accordingly, the output of harmonic light can be uniform and stable. Also, as the incident end of the wavelength converter needs no particular arrangement, the overall construction can be simple.

As a second aspect of the prevent invention, the solid laser apparatus having the above described construction modified in which the wavelength of the input light lies in the range from 900 nm to 1100 nm, the wavelength bandwidth of reflected light from the grating part is equal to or greater than 0.1 nm, and the distance is equal to or greater than 7 mm.

Assuming that the center wavelength $\lambda$ is 1100 nm and the spectrum width $\Delta\lambda$ is 0.1 nm, the coherent length lc of the light released from the optical resonator is $$lc = \lambda^2/\Delta\lambda = 12.1 \text{ mm}$$

The solid laser apparatus of the second aspect has the distance between the grating part and the wavelength converter set to not smaller than 7 mm which is equal to or greater than ½ the coherence length lc. More specifically, the length of the light path of the light released from the grating part, reflected by the wavelength converter, and returned back to the grating part is greater than the coherent length. This allows the return of light transmitted from the grating part to the source of laser light to remain not interfered by the light reflected from the wavelength converter even when the center wavelength $\lambda$, the spectrum width $\Delta\lambda$, and the positional accuracy are varied. Accordingly, the output of harmonic light can be uniform and stable.

ADVANTAGE OF THE INVENTION

As set forth above, the wavelength converting laser apparatus according to the present invention allows a difference in the length of the light path between the light reflected by the grating part and returned to the semiconductor light amplifier and the light reflected by the wavelength converter, passed through the grating part, and returned back to the semiconductor light amplifier to be greater than the coherent length, hence generating no interference of the light and making its output of harmonic light stable. Also, as the incident end of the wavelength converter needs no particular arrangement, the overall construction can be simple.

Figure 1:
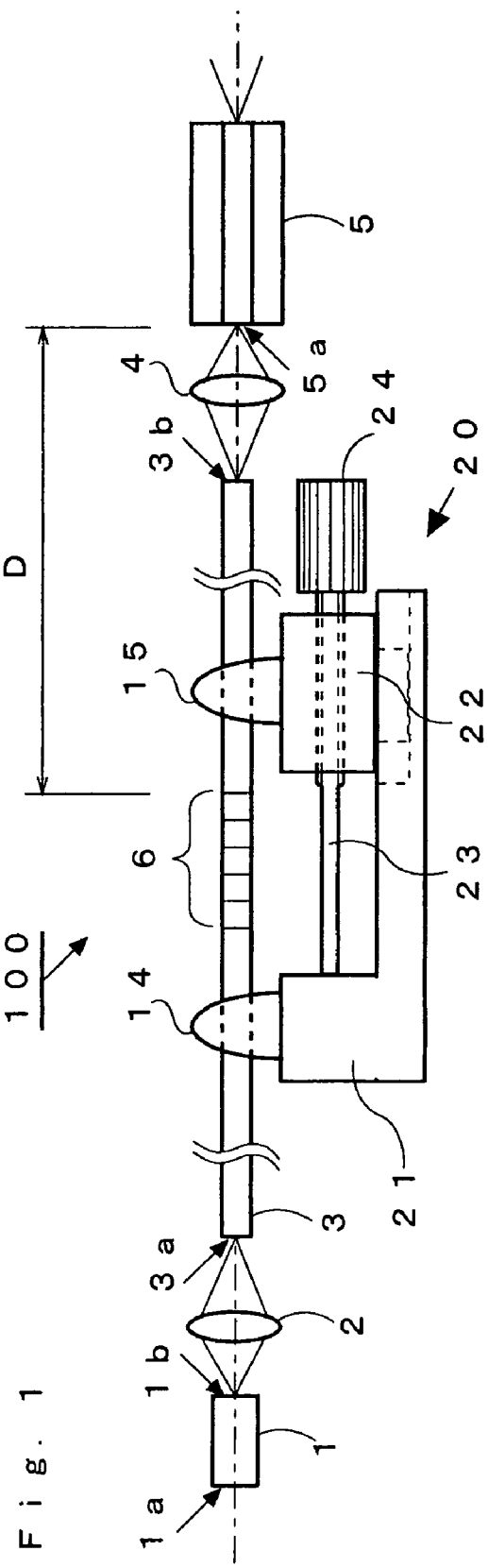
FIG. 1 is a schematic view of a wavelength converting laser apparatus showing one embodiment of the present invention, in which the primary components are

1. semiconductor light amplifier, 2 4. lens, 3. optical fiber, 5. wavelength converter, 6. grating part, 20. grating part expander mechanism, 100. wavelength converting laser apparatus.

BEST MODES FOR EMBODYING THE INVENTION

Preferred embodiments of the present invention will now be described referring to the relevant drawings. It would be understood that the present invention is not limited to the described embodiments.

FIG. 1 is a schematic view of a wavelength converting laser apparatus 100 showing the embodiment of the present invention.

The wavelength converting laser apparatus 100 comprises a semiconductor light amplifier 1 having a function of generating and amplifying the intensity of light through feeding the area defined by a light reflecting side 1a and a light output side 1b with current, a lens 2 for collecting the light generated by the semiconductor light amplifier 1, an optical fiber 3 having a grating part 6 provided therein, a lens 4 for collecting the light released from the optical fiber 3, a wavelength converter 5 for releasing a second harmonic of the input light, and a grating part expander mechanism 20 holding the optical fiber 3 at two locations, that is, a first holder 14 and a second holder 15, between which the grating part 6 is present.

The distance D between the grating part 6 and the wavelength converter 5 is set to not smaller than ½ the coherent length of the light released from the optical fiber 3 and preferably 5 to 50 times the coherent length of the light.

The semiconductor light amplifier 1 generates and amplifies, for example, the light of the range from 900 nm to 1100 nm in the wavelength λ. The light reflecting side 1a is provided with a coating for having a high level of the reflectivity while the light output side 1b is provided with a coating for having a low level of the reflectivity.

The incident end 3a of the optical fiber 3 is preferably configured to a taper or wedge shape for receiving more of the light from semi conductor light amplifier 1. This allows the overall construction to be simple with no use of the lens 2.

The grating part 6 is arranged for changing the refractive index at regular intervals in a predetermined region of the optical fiber 3. It is, for example, fabricated by an ultraviolet laser beam emitted from, e.g., an excimer laser being divided into two lights by a beam splitter, passed through different light paths, and overlapped each other over the optical fiber to generate a pattern of interference, so that the refractive index is varied at regular intervals equal to the pattern of interference caused by a photo refractive action of the optical fiber corresponding to the intensity of the ultraviolet light.

The grating part 6 reflects a desired range of the wavelengths of light having, for example, a spectrum width Δλ equal to or greater than 0.1 nm (e.g. 0.6 nm) of which the center wavelength λ is between 900 nm and 1100 nm. The center wavelength λ may be modified through changing the intervals at which the refractive index is varied by adjusting the length of the grating part 6 with the grating part expander mechanism 20.

The grating part expander mechanism 20 comprises a base 21, a movable nut 22 arranged slidable over and along the base 21, a lead screw 23 on which the movable nut 22 is threaded, and an operating unit 24 for turning the lead screw 23 with the use of a hand or a tool. The first holder 14 is mounted to the base 21 while the second holder 15 is mounted to the movable nut 22. The first holder 14 and the second holder 15 are securely joined to the optical fiber 3 by adhesive bonding or soldering.

When the lead screw 23 is turned by operating the operating unit 24, the movable nut 22 slides on and along the base 21 to vary the distance between the first holder 14 and the second holder 15. This causes the grating part 6 to extend or retract thus changing the intervals at which the refractive index is varied. As a result, the light transmitted from the optical fiber 3 to the wavelength converter 5 can be matched with the acceptable wavelength range of the wavelength converter 5.

The semiconductor light amplifier 1 and the grating part 6 constitute an optical resonator. Inaction, the light released from the semiconductor light amplifier 1 is focused by the lens 2 and transmitted to the incident end 3a of the optical fiber 3. The light received by the optical fiber 3 is reflected at a wavelength range determined by the grating part 6 and returned back to the semiconductor light amplifier 1, where it is amplified again. The amplified light is released from the semiconductor light amplifier 1 and received by the optical fiber 3. By repeating this action, a desired wavelength range of the light determined by the grating part 6 can be released from the output end 3b of the optical fiber 3.

The desired wavelength light released from the output end 3b of the optical fiber 3 is then focused by the lens 4 on one end 5a of the wavelength converter 5. The lens 4 is provided with a non-reflection coating.

The wavelength converter 5 may be made of a material selected from $LiNbO_3$, $LiTaO_3$, $MgO:LiNbO_3$, $MgO:LiTaO_3$, $KNbO_3$, and $KTiOPO_4$ or its periodically polarization inverted form provided with an optical waveguide. When receiving a light beam of 900 nm to 1100 nm in the wavelength, the wavelength converter 5 releases its second harmonic of which the wavelength is from 450 nm to 550 nm.

Most of the light focused on the one end 5a of the wavelength converter 5 by the lens 4 is received by the wavelength converter 5. Also, a portion of the light is reflected and returned back to the optical fiber 3. The return of light entering the optical fiber 3 is passed through the grating part 6 and received by the semiconductor light amplifier 1. At the time, the return of light may be overlapped with its reflection on the grating part 6 hence generating a pattern of interference.

However, the distance D between the grating part 6 and the wavelength converter 5 is not smaller than ½ the coherent length or preferably 5 to 50 times the coherent length of the light released from the optical fiber 3. This can prevent the generation of interference and allow the harmonic output to stay uniform. In addition, as the input end of the wavelength converter 5 requires no particular arrangement, the overall construction can be simple.

For instance, the distance D may preferably be set to from 7 mm to 600 mm.

Assuming that the center wavelength λ is 1100 nm and the spectrum width λ is 0.1 nm, the coherent length lc of the light released from the optical fiber 3 is $$lc = \lambda^2/\Delta\lambda = 12.1 \text{ mm}.$$

Then, the distance D is equal to ½ to 50 times the coherent length lc. Accordingly, the total length of the light path of the return of light released from the grating part 6, reflected by the wavelength converter 5, and returned back to the grating part 6 is substantially 1 to 100 times the coherent length lc. In other words, a difference in the length of the light path between the light reflected by the grating part 6 and returned to the semiconductor light amplifier 1 and the light reflected by the wavelength converter 5, passed through the grating part 6, and returned back to the semiconductor light amplifier 1 is equal to 1 to 100 times the coherent length lc.

INDUSTRIAL APPLICABILITY

The solid laser apparatus according to the present invention is allowed to be employed in such as bioengineering field and measuring field.

What is claimed is:

1. A solid laser apparatus comprising a semiconductor light emitter, an optical fiber having a grating part provided therein, and a wavelength converter for receiving an input of light from an optical resonator composed of the semiconductor light emitter and the optical fiber and releasing its harmonic light, wherein the distance between the grating part and the wavelength converter is equal to or greater than ½ of the coherent length of the input light.

2. A solid laser apparatus according to claim 1, wherein the wavelength of the input light lies in the range from 900 nm to 1100 nm, the wavelength range of reflected light from the grating part is equal to or greater than 0.1 nm, and the distance is equal to or greater than 7 mm.

* * * * *